United States Patent [19]
Saito

[11] Patent Number: 6,136,429
[45] Date of Patent: Oct. 24, 2000

[54] ELECTROMAGNETIC SHIELDING AND WAVE ABSORPTION SHEET AND THE PRODUCTION OF THE SAME

[75] Inventor: Akihiko Saito, Nagoya, Japan

[73] Assignee: Daido Tokushukou Kabushiki Kaisha, Nagoya, Japan

[21] Appl. No.: 09/035,809

[22] Filed: Mar. 6, 1998

[30] Foreign Application Priority Data

Mar. 14, 1997 [JP] Japan ................................ 9-060394
Dec. 22, 1997 [JP] Japan ................................ 9-352599

[51] Int. Cl.$^7$ .............................................. B32B 5/16
[52] U.S. Cl. ..................... 428/323; 428/338; 428/332; 428/328; 428/212; 428/329
[58] Field of Search ................................ 428/332, 338, 428/323, 328, 457, 458, 329, 212

[56] References Cited

U.S. PATENT DOCUMENTS 4,992,329  2/1991  Ishii et al. .
5,260,128  11/1993  Ishii et al. ................................ 428/328

Primary Examiner—William Krynski
Assistant Examiner—Dawn L. Garrett
Attorney, Agent, or Firm—Bacon & Thomas

[57] ABSTRACT

An object of the present invention is to provide a shielding sheet which has a high and stable shieldability to electromagnetic waves, has a sufficient pliability, and can be easily wound around a cable and the like. The shielding sheets 1, 1', and 1" each having a pliable insulating layer 2, a powder layer 3 in which a powder 4 made of soft magnetic metal or alloy, having an average particle diameter of less than 100 μm, is buried in layers along at least one surface of the insulating layer 2 and/or at the midpoint position along the thickness direction. It also includes a shielding sheet 1a in which a powder 4 is distributed in the middle portion 5 of the insulating layer 2 at the ratio of less than 70% by volume to the powder layer 3, 3 along both surfaces. Furthermore, shielding sheets 1, 1a, 1', and 1", in which a powder 4 of the powder layer is flat shaped, the aspect ratio being more than 2, and the powder is buried in a manner that the longer diameter direction of the powder is almost along the plane surface direction of the insulating layer 2, are also included within the scope of the present invention.

10 Claims, 6 Drawing Sheets

ELECTROMAGNETIC SHIELDING AND WAVE ABSORPTION SHEET AND THE PRODUCTION OF THE SAME

BACKGROUND OF THE INVENTION

1. Field of the Invention

The present invention relates to a shielding sheet for shielding magnetism and a radio wave, and absorbing a radio wave, and the production method of the same.

2. Description of the Related Art

In recent years, computers are used in a wide variety of fields due to the development of communication and information technology, and the systematization of the network has progressed, in which computers are connected through a digital circuit. In the manufacturing industry, many sorts of controlling machines, measuring instruments, sensors, etc. are used in system, resulting from the factory automatization through computers.

However, it comes into question that radio waves of various wave length generated from conductive cables or motors around the computers or various machines and instruments, or illegal radios, form noise causing troubles of computer malfunction or communication failure.

It is also regarded as a matter in question that since the magnetism (alternating magnetic field) from electric cables and motors and so on for power sources leaks to the surroundings, electronic circuits and controlling devices in various equipment cause failures and stoppages. In order to prevent the leakage of the radio waves and magnetism (it will be called an electromagnetic wave, hereafter) or prevent the influence thereof, various shielding materials are proposed.

Figure 8A:
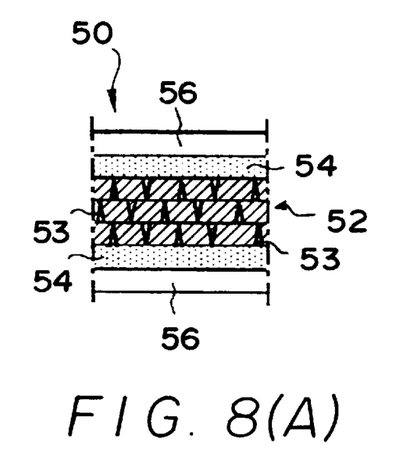
Figure 8B:
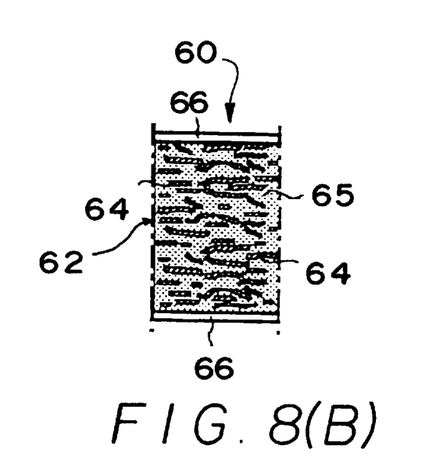

For instance, as shown in FIG. 8 (A), an electromagnetic wave shielding substance 50 which is composed of an electromagnetic wave shielding layer 52 in which a soft magnetic powder 53 is uniformly dispersed in layers, held between resin sheets 56, 56 with an adhesive agent 54, 54, or, as shown in FIG. 8 (B), another electromagnetic wave shielding substance 60 which is composed of an electromagnetic wave shielding layer 62 in which a flat shaped soft magnetic powder 64 is mixed and uniformly dispersed in a resin 65, covered on both surfaces with a resin film 66, have been proposed (refer to Japanese Patent Laid-open Hei 8-31237).

Since such electromagnetic wave shielding substances 50, 60 have pliability, the shielding substances 50, 60 are wound as a shielding material around an electric cable (not shown) with joining means, such as a slide fastener, along both margins. This method can shield the electromagnetic wave leaked from the electric cable, and can shield interference by the electromagnetic wave from the outside, and can be applied at the working site. (refer to the Patent Bulletin cited above).

However, since the above shielding substance 50 uses the electromagnetic wave shielding layer 52, in which the soft magnetic powder 53 itself is uniformly dispersed in a layer, the shielding substance is heavy and inconvenient to install at the working site, though it looks to have an excellent shieldability. And it has a disadvantage that since both surfaces of the shielding layer 52 are stacked only with flexible resin sheets 56 and adhesives 54, when the shielding substance is wound around the electric cable in a circle, the above shielding layer 52 is apt to collapse in the inside, so that the thickness is changed and the shieldability becomes uneven depending upon the position.

On the other hand, since the shielding substance 60 uses the electromagnetic wave shielding layer 62 in which the flat shaped soft magnetic powder 64 is mixed and uniformly dispersed in the resin 65, the shieldability is uniform and the shielding substance 60 can be easily installed at the working site. However, since the above powder 64 is dispersed all over the resin 65, the shieldability is lowered. When the powder 64 is dispersed in a large quantity in the resin 65 to prevent the lowering, it causes a disadvantage that the pliability of the resin sheet is impaired, resulting in gaining in weight though the shieldability is increased, and the installation at the working site becomes difficult.

An object of the present invention is to provide a shielding sheet which overcomes the disadvantages held by the conventional art, having a high, stable shieldability against the electromagnetic wave, keeping a sufficient pliability all around the sheet, and is able to easily carry out the rolling up process to, for instance, an electric cable, and the method of production thereof

SUMMARY OF THE INVENTION

The present invention is invented from an idea that both the shieldability and the pliability required for a shielding sheet is obtained by burying a soft magnetic metal powder in layers along the surface or at the midpoint position of an insulating layer, such as rubber.

The shielding sheet of the present invention is characterized by the composition of an insulating layer having pliability and a powdery layer in which powder made of soft magnetic metal or alloy, having an average particle diameter of less than 100 $\mu$m is buried in layers along at least one side of the surface of the insulating layer and/or at about the midpoint position along the thickness thereof.

The other shielding sheet is characterized by the composition of an insulating layer having pliability and a powdery layer in which powder made of soft magnetic metal or alloy, and having an average particle diameter of less than 100 $\mu$m is buried in layers along at least one side of the surface of the insulating layer and/or at about the midpoint position along the thickness, and the distribution of the powder is less than 70% by volume in the insulating layer other than the powder layer described above.

By taking the configuration that the powder is buried in layers in a part of such a pliable insulating layer, a shielding sheet having shieldability and pliability in a good balance can be obtained.

The soft magnetic metals are iron, nickel or cobalt, and the alloy includes silicon steel, permalloy alloy, Sendust alloy, electromagnetic stainless steel such as Fe—Cr—Al series or Fe—Cr—Al—Si series, Fe—Co—V series alloys, and amorphous alloys of Co series or Fe series, furthermore ferrite series oxides.

A shielding sheet in which the powder described above is flat in shape, its aspect ratio being more than 2, and is buried in a manner that the direction along the longitudinal diameter of the powder is almost parallel to the plane surface of said insulating layer (the direction perpendicular to the thickness), is also included in the shielding sheet in the present invention.

An aspect ratio is a ratio of the longer or shorter diameter of the powder to the thickness. Therefore a powder having an aspect ratio of more than 2 is a powder having, for instance, an average longer diameter of less than 100 $\mu$m, an average shorter diameter of less than 50 $\mu$m and the thickness of less than 10 $\mu$m. It becomes more desirable to use a powder having the aspect ratio of more than 5 for restraining diamagnetic field. By using such a powder, a high shieldability can be obtained with a small quantity of the powder.

A shielding sheet in which the powder is contained at the rate of more than 20% by volume or more than 40% by weight (for instance, 80% by weight) is also included within the concept of the present invention.

With the configuration described above, a shielding sheet having higher shieldability than that possessed by the conventional shielding sheet can be obtained with the same amount of the powder. But when the content of the powder exceeds 80% by volume or 98% by weight, the holding power of the insulating layer begins to decrease and the pliability also decreases, therefore, it is desirable to adjust the content of the powder to be less than 80% by volume (for instance, 60%) or less than 98% by weight.

Additionally, a shielding sheet having the insulating layer made of rubber or plastic is also included within the concept of the present invention. The aforementioned rubber includes natural rubber, not to speak of various kinds of synthetic rubber, such as chloroprene, and as the plastic, all kinds of resin having pliability can be applicable. Sufficient pliability can be obtained by adjusting the thickness of the shielding sheet to be less than several millimeters, for instance, less than 5 mm, preferably less than 2 mm, more preferably less than 1 mm. Since the powder holding capability of the sheet becomes unstable when the thickness of the shielding sheet is less than 0.1 mm, it is advisable to adjust the thickness of the shielding sheet to be more than 0.1 mm, more preferably more than 0.5 mm.

The production method of the shielding sheet of the present invention is characterized by the adding process in which a powder made of soft magnetic metal or alloy, and having an average particle diameter of less than 100 $\mu$m, is added to the surface or inside of the insulating material having pliability, such as rubber and the like, and the forming process in which the insulating material to which the powder is added, is formed in a sheet, and the powder is buried in layers along at least one surface of the insulating layer and/or at some midpoint position along the thickness direction.

As for the aforementioned forming process, any method is available, but it is preferable for obtaining uniform shieldability and effective productivity to use a roll forming process in which the insulating material is passed through between a pair of adjacent rollers or an extrusion forming process in which the insulating material is passed through a flat mold while being pressed.

BRIEF DESCRIPTION OF THE DRAWINGS

FIG. 1 (A) to FIG. 1 (D) are fragmentary sectional views showing each embodiment of a shielding sheet according to the present invention;

FIG. 2 (A) to FIG. 2 (C) are diagrammatic views showing production processes of a shielding sheet according to the present invention, and FIG. 2 (D) is an enlarged sectional view of D portion shown with a dashed line in FIG. 2 (C);

FIG. 3 (A) is a diagrammatic view showing another production processes of the shielding sheet according to the present invention, and FIG. 3 (B) is an enlarged sectional view of B portion shown with a dashed line in FIG. 3 (A);

FIG. 4 (A) and FIG. 4 (B) are diagrammatic views showing still another production processes of a shielding sheet according to the present invention, and FIG. 4 (C) is an enlarged sectional view of C portion shown with a dashed line in FIG. 4 (B);

FIG. 5 (A) and FIG. 5 (B) are fragmentary sectional views of a shielding sheet according to the present invention, and FIG. 5 (C) and FIG. 5 (D) are fragmentary sectional views of each shielding sheet according to the comparisons;

FIG. 7 (A) to FIG. 7 (C) are diagrammatic views showing cables wound with the shielding sheets of the present invention; and Both FIG. 8 (A) and FIG. 8 (B) are fragmentary sectional views of the conventional shielding sheets.

DETAILED DESCRIPTION OF THE PREFERRED EMBODIMENT(S)

The following explanation relates to a preferable embodiment of the present invention with drawings.

FIGS. 1 are partial cross sectional views schematically showing a shielding sheet of the present invention. The shielding sheet 1 in FIG. 1 (A) has an insulating layer 2 made of a polychloroprene rubber in a sheet form, and a powder layer 3, 3 in which a flat shaped soft magnetic metal powder (flake powder) 4 is buried in layers along both surfaces in the insulating layer 2 so that the longer diameter is parallel to the plane surface of the insulating layer 2. Suppose that the total thickness of the sheet 1 is 1 mm, the thickness of the powder layer 3 made of metal powder 4 is about 0.2 mm.

Figure 1A:
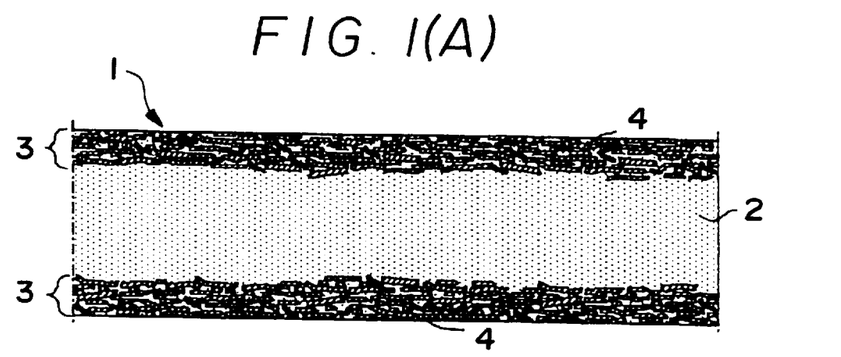
Figure 1B:
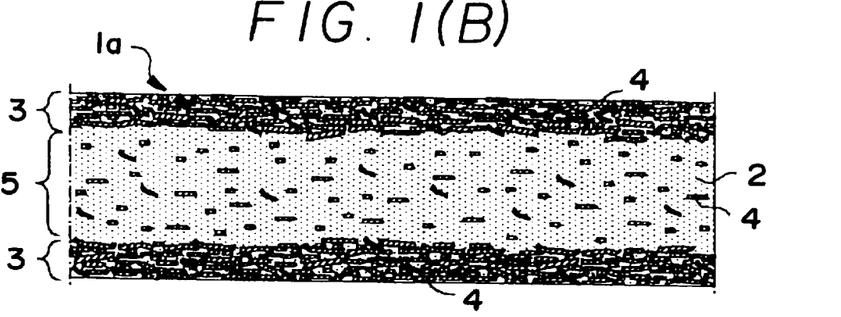

The metal powder 4, such as PC permalloy −1 (80 wt % Ni—Fe), is formed into powder having an average particle diameter of less than 100 $\mu$m through an atomizing method, and then the powder is put into a ball mill called Attritor to be crushed. As a result of the above processes, the flat shaped powder 4 having an average longer diameter of less than 100 $\mu$m, an average shorter diameter of less than 50 $\mu$m, and an average thickness of 10 $\mu$m, or the aspect ratio of more than 2, more concretely more than 5, can be obtained.

The shielding sheet 1 relating to the present invention, has a cross-sectional structure in which a powder layer 3 made of metal powder 4 is buried in a layer along both surfaces of the shielding sheet, and an insulating layer 2 made of a polychloroprene rubber is occupied in the inside. And the metal powders 4 are configured to be closer with each other by forming a layer, when compared with the conventional shielding sheet in which the same amount of the metal powder is uniformly dispersed in the whole sectional area. Therefore the shieldability against electromagnetic waves can be improved and at the same time the pliability of the shielding sheet 1 can be secured.

The shielding sheet 1a of FIG. 1 (B) has an insulating layer 2 in a sheet, and along both surfaces of the insulating layer 2, powdery layers 3, 3 which are made of flat shaped soft magnetic metal powders 4 buried in layers in a manner that the direction along the longer diameter of the metal powder is parallel to the plane surface of the insulating layer 2, and moreover, the metal powder 4 is allowed to be randomly buried at the rate of less than 70% by volume in the middle portion 5 along the thickness direction of the insulating layer 2 held by the powder layers 3, 3. In an actual production process, sometimes it is difficult to clearly separate the distribution of the metal powders 4 between the surface side and the middle portion in the insulating layer 2, as in the case of the shielding sheet 1. Especially, when the thickness of the shielding sheet becomes thinner, the distribution pattern of the powder 4 shown in FIG. 1 (B) is more likely to come about. The shielding sheet 1a, having a distribution pattern in which the powder 4 in the middle portion 5 occupies less than 70% by volume to the powder 4 in the powder layer 3 near the surface, also possesses the same shieldability as the shielding sheet 1 has.

The shield sheet 1' shown in FIG. 1 (C) has an insulating layer 2 made of polychloroprene rubber, and a powder layer 3 in which the metal powder 4 is buried in layers only on the one side of the surface of the insulating layer 2 in a manner that the longer diameter direction is arranged along the plane surface of the insulating layer 2. Incidentally, in the sheet 1', suppose the total thickness is 1 mm, the thickness of the powder layer 3 is about 0.2 mm.

Figure 1C:
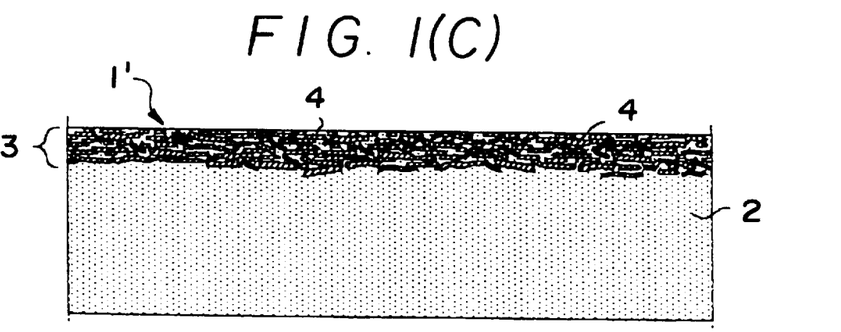

The shielding effect of the shielding sheet 1' can be reliably obtained when the powder layer 3 made of the metal powder 4 is placed toward the space to be shielded. For instance, when the leakage of the electromagnetic wave from the electric cable needs to be protected, the powder layer 3 is inwardly wound, while the communication cable needs to be protected from the outside electromagnetic wave, the powder layer 3 is outwardly wound.

In addition, since only the thickness of the insulating layer 2 becomes thicker compared with the shielding sheets 1 and 1a, the pliability of the shielding sheet 1' itself is increased, the weight being decreased and the usage of the metal powder 4 can be decreased. Incidentally, the powder 4 can be distributed by the amount of less than 70% by volume in the insulating layer 2 excepting the powder layer 3.

Furthermore, the shielding sheet 1" shown in FIG. 1 (D) has an insulating layer 2 made of polychloroprene rubber, and the powder layer 3 in which the metal powder 4 is buried in layers at about the midpoint position along the direction of the thickness of the insulating layer 2 in a manner that the longer diameter direction of the metal powder 4 is arranged along the plane surface of the insulating layer 2.

Figure 1D:
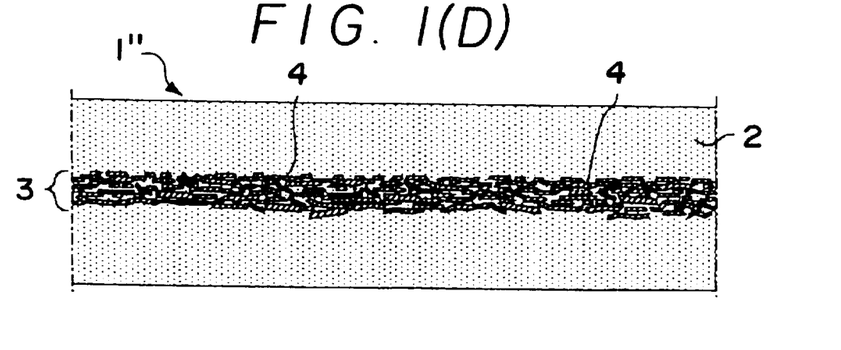

The shielding sheet 1" has no difference between two sides thereof, not as in the case of the shielding sheet 1', and the shielding effect can be reliably obtained. Besides, since it has sufficient pliability, it can be easily wound around the cable, and since the metal powder 4 is not exposed, the stable shieldability can be obtained without peeling of the metal powder. The powder 4 can be distributed by the amount of less than 70% by volume in the insulating layer 2 excepting the powder layer 3.

Additionally, by properly combining each cross sectional configuration of the shielding sheets 1, 1a, 1' and 1", a shielding sheet (not shown) can be prepared. In such shielding sheet, a plurality of powder layers 3 which are made of the metal powder 4 are buried in the shielding sheet. One layer 3 is buried at about the midpoint position along the direction of the insulating layer 2 and another powder layer 3 is buried along at least one side of the surfaces of the insulating layer 2.

FIGS. 2 explain the method of production for the shielding sheet 1' in order of the production process. FIG. 2 (A) shows that the insulating material 2 made of polychloroprene rubber is perpendicularly inserted between a pair of oppositely placed smoothing rollers 10, whose peripheral surfaces are adjacent to each other, and the metal powder 4 is added on the left side surface of the inserted insulating material 2 by jetting it, with air pressure, for instance. The insulating material 2, to which the powder 4 is added on the surface, is made thinner, as shown in FIG. 2 (B), while it passes through the rollers 10 little by little, and each metal powder 4 is arranged in the direction of the longer diameter along the direction of the passage.

Figure 2A:
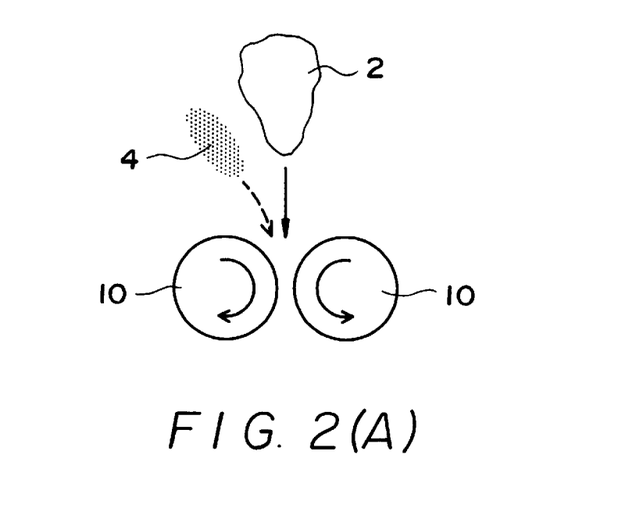
Figure 2B:
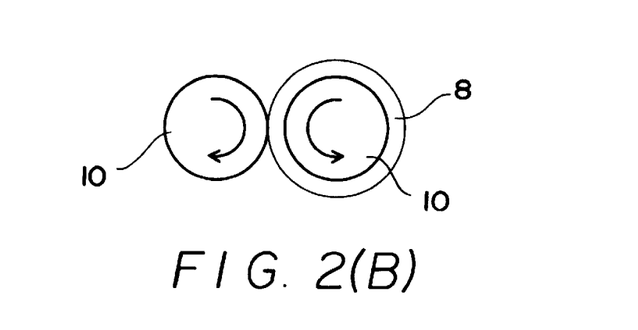
Figure 2C:
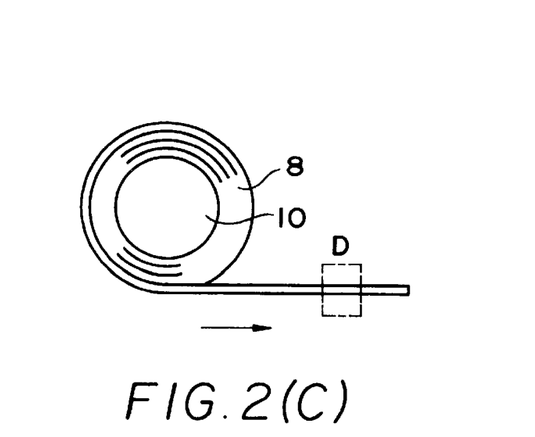
Figure 2D:
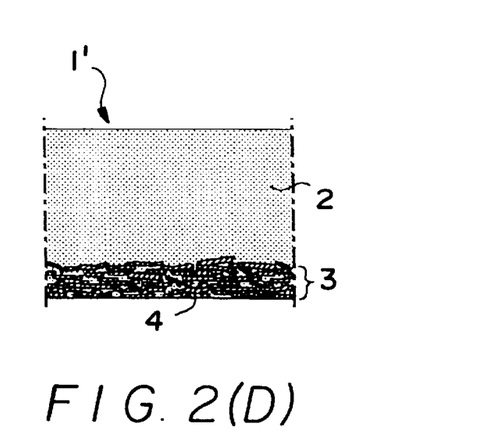

When passed through the rollers 10, since the surface to which the powder 4 is not added, has adhesive power, the insulating material 2 is wound in a thin multilayered state on the circumferential surface of one of the rollers 10 (the right side roller), resulting in a stacked coil form 8. Furthermore, as shown in FIG. 2 (C), by rewinding the stacked coil 8 from the roller 10, as shown in FIG. 2 (D), the shielding sheet 1' which has the powder layer 3 in which the metal powder 4 is buried in layers along the one surface (the bottom) of the insulating layer 2, can be obtained.

Figure 3A:
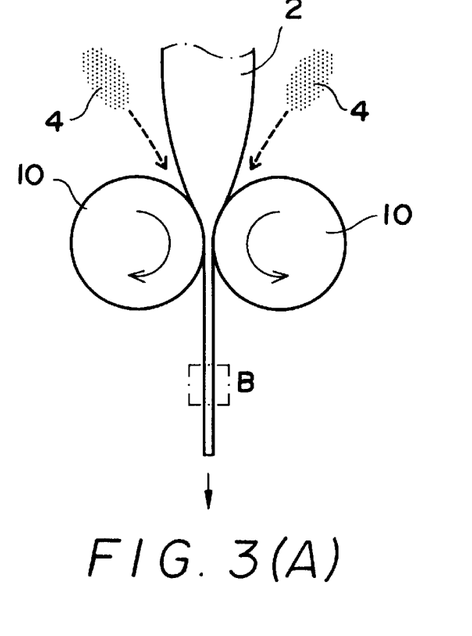

FIG. 3 shows an outline of the process for the manufacturing method of the shielding sheet 1. FIG. 3 (A) shows the state that the insulating material 2 made of synthetic rubber is perpendicularly inserted between a pair of smoothing rollers 10 which is the same type as the aforementioned roller, and the metal powder 4 is added on both surfaces of the inserted insulating material 2 by jetting and the like. The insulating material 2 to which the powder 4 is added on the surfaces, is extended thinner as it passes through the rollers 10, and the metal powder 4 on each surface is arranged in the direction of the longer diameter along the direction of the passage.

Figure 3B:
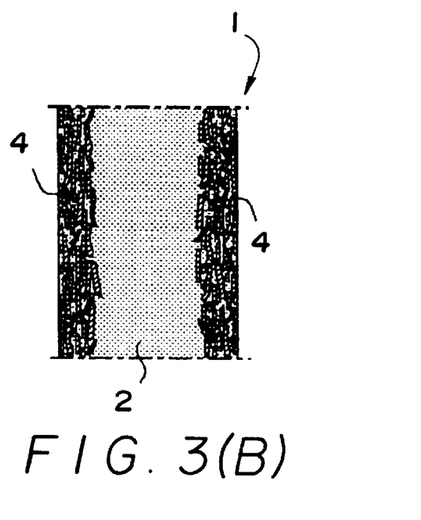

As a consequence, as shown in FIG. 3 (B), a shielding sheet 1 having the powder layers 3, 3 in which the metal powder 4 is buried in a layer along both surfaces of the insulating layer 2, can be obtained.

Figure 4A:
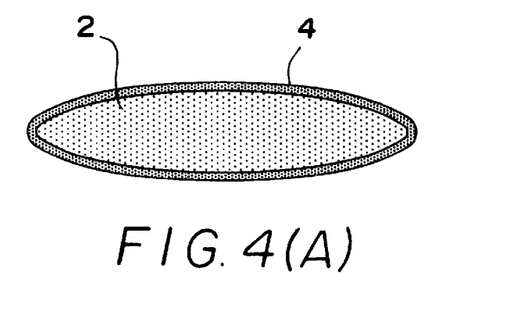
Figure 4B:
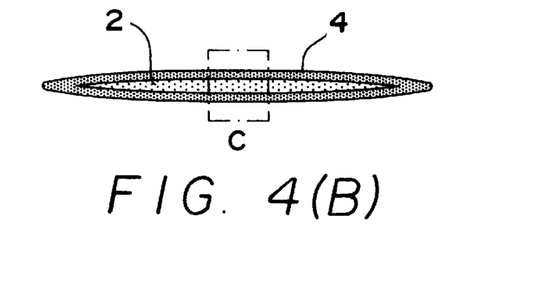
Figure 4C:
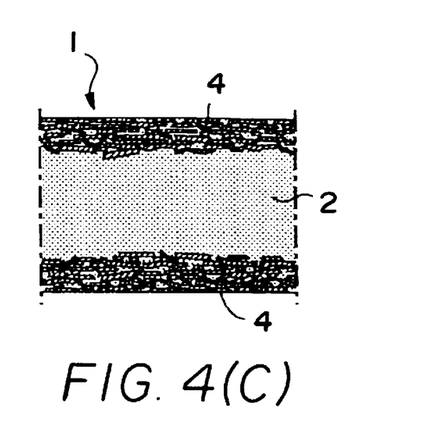
Figure 5A:
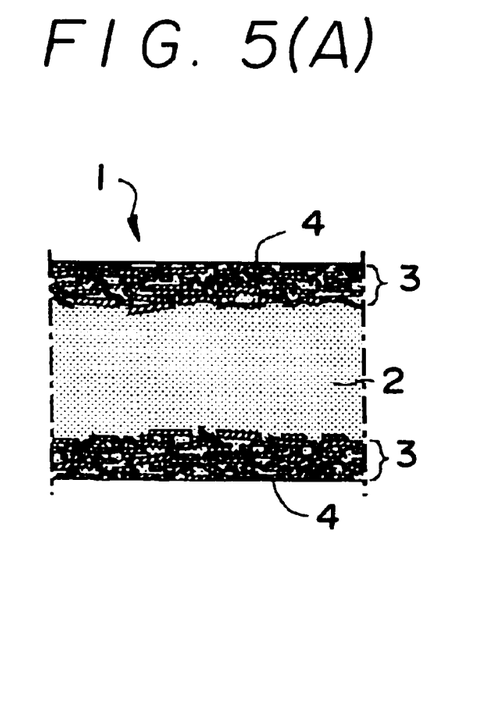
Figure 5B:
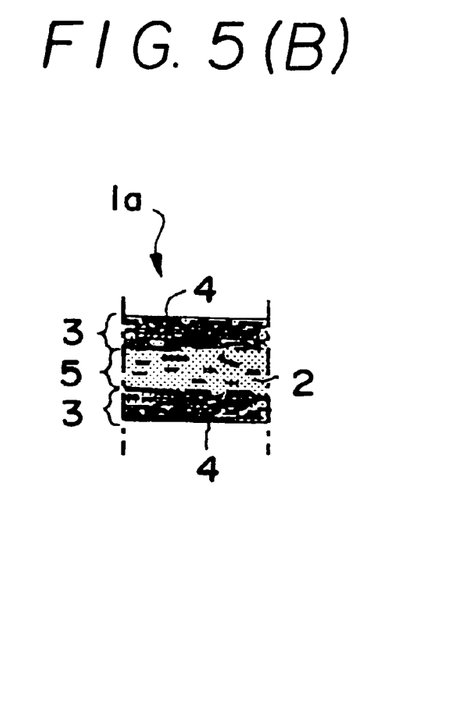
Figure 5C:
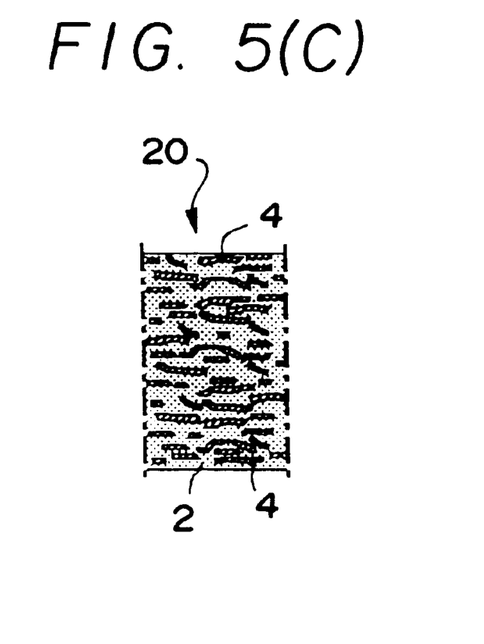
Figure 5D:
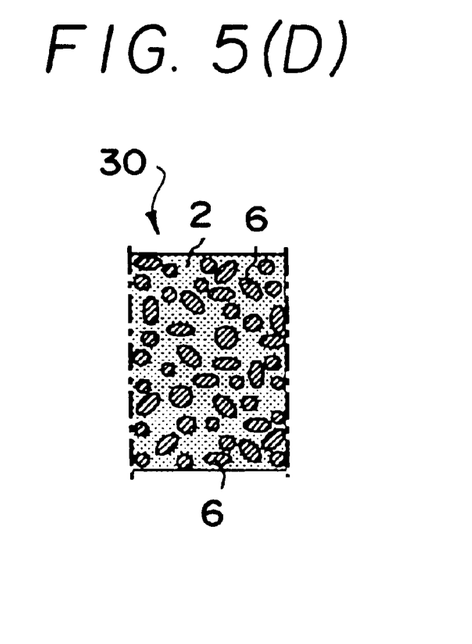

FIGS. 4 relate to the other production method for the shielding sheet 1. As shown in FIG. 4 (A), the metal powder 4 is almost uniformly added to the whole surface of the insulating material 2 made of a blocky synthetic rubber, in advance. Next, as shown in FIG. 4 (B), the insulating material 2 to which the powder 4 is added on the surface, is extended thinner by pressing vertically with a press machine and the like. Then, the central portion of the thin formed insulating material 2 is cut in a predetermined size. Thus, as shown in FIG. 4 (C), the shielding sheet 1, having the powder layer 3, 3 in which the metal powder 4 is buried in layers along both surfaces of the insulating layer 2, can be obtained.

The shielding sheet 1 can be manufactured by the extrusion method that the insulating material 2 which the powder 4 is added on the surface thereof, is stuffed into a cavity of a mold having a flat opening (not shown), and is extruded by pressing from behind.

The shielding sheet 1' can be obtained by slicing the sheet 1 of which insulating layer 2 is made thick in advance, into two equal parts along the plane surface.

Furthermore, in order to obtain the shielding sheet 1", for instance, the metal powder 4 is continuously added into an opening between two insulating materials 2, 2 which approach each other, from upwards so that the metal powder 4 is held between the two insulating materials 2, 2, and they are pushed into the pair of rollers 10 and allowed to pass successively, or extruded in a manner as described above.

Additionally, by replacing any one of the smoothing rollers 10 with a roller having fine and continuous uneven stripes or a concave group engraved on the circumferential surface, projected stripes or projections for skidproof can be formed on the surface of the sheet 1, 1a, 1' and 1", which is effective, for example, when it is laid on the floor of, for instance, a computer room.

The shieldability of the shielding sheet 1 and others of the present invention is explained next with comparisons.

First, as shown in FIG. 5 (A), a shielding sheet 1 (example 1) having a powder layer 3, 3 in which powder 4 is buried at the rate of 60% by volume along both surfaces of an insulating layer 2 whose thickness is 1 mm, is prepared. The metal powder 4 is made of PC permalloy—1, the average longer diameter being less than 100 μm, the average shorter diameter being less than 10 μm, and the average thickness being less than about 1 μm, or the aspect ratio is more than 10, and the direction of the longer diameter is almost along the plane surface of the shielding sheet.

In addition, the shielding sheet 1 which is separately prepared is further rolled and a shielding sheet 1a (example 2) having thickness of 0.5 mm, is prepared as shown in FIG. 5 (B). The sheet la has a powder layer 3, 3 made of metal powder 4 along the upper and lower surfaces, and the another metal powder 4 is distributed in the middle portion 5 between the powder layers 3, 3 at the rate of about 30% by volume to the powder layer 3.

As comparisons, a shielding sheet 20 (comparison 1) in which a flat shaped powder 4 made of the same PC permalloy—1 as above is almost uniformly buried in the whole insulating layer 2 having a thickness of 1 mm, at the rate of 60% by volume, as shown in FIG. 5 (C), and another shielding sheet 30 (comparison 2) in which granular powders 6, having an average longer diameter of less than 100 μm, and being made of the same PC permalloy—1 as above, is uniformly buried in the whole insulating layer 2 of 1 mm thick at the rate of 60% by volume, as shown in FIG. 5 (D), are prepared.

These sheets are rolled up into cylinders (50 mm in diameter, 150 mm in height) and are perpendicularly inserted between a pair of confronting Hermholtz coils, and the alternating magnetic field of 1 gauss is applied to both coils by flowing an alternating current of 50 Hz.

Figure 6:
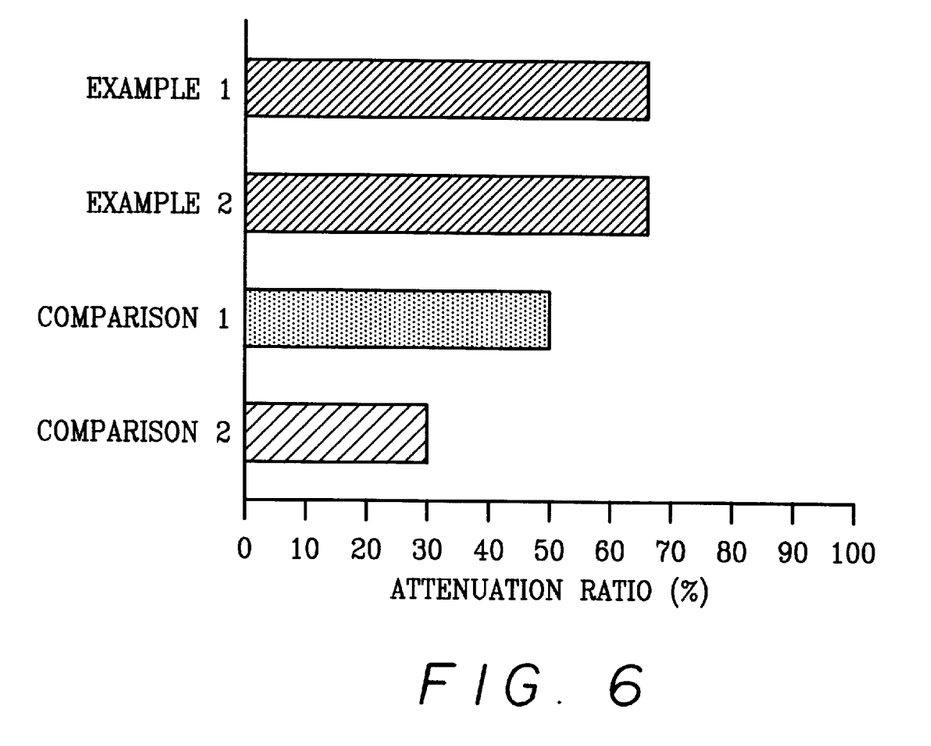
FIG. 6 is a bar chart showing the attenuation ratio of the magnetic field of each shielding sheet in examples according to the present invention and comparisons.

The attenuation ratio of the magnetic field is measured by inserting the gauss meter into each cylindrical sheet 1, 1a, 20, and 30. The result of the measurement is shown in a bar chart in FIG. 6. FIG. 6 shows that the shielding sheets 1 and 1a in example 1 and 2 can shield 65% of the magnetic field, but the shielding sheet in comparison 1 can shield only 50%, and another shielding sheet in comparison 2 can shield only 30% of the magnetic field from the outside. The reason is thought that because the powder layer 3 existing along both surfaces is high in density and easy to shield the magnetic field in the sheet 1 and 1a of the present invention, but in the sheet 20 in comparison 1, the magnetic field which passes through the sheet, is increased, because the same powder 4 is dispersed in the whole cross sectional area of the insulating layer 2. Besides, in the sheet 30 of comparison 2, since an almost granular powder just atomized is dispersed in the whole cross sectional area of the insulating layer 2, the sheet is easily affected by the magnetic field, and the magnetic field which passes through the sheet, is more increased. Incidentally, the measurement is carried out only for the attenuation ratio of the magnetic field in the above experiments, but a similar result is obtained in the measurement for radio waves. (electric field)

Figure 7A:
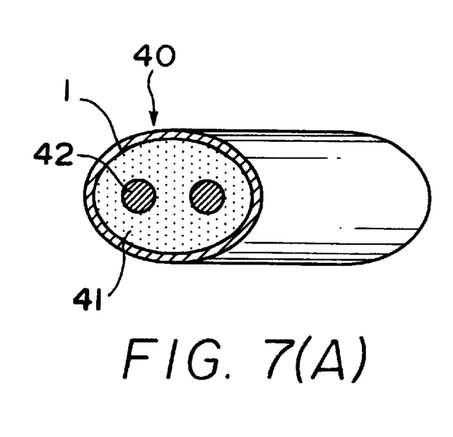

FIGS. 7 show the usage of the shielding sheet 1 of the present invention, and FIG. 7 (A) shows a communication cable 40 with the shielding sheet 1 wound on the surface. In this case, a pair of lead wire 42 is a so-called twist-pair wound by an insulating material 41. The surface of the insulating material 41 is, in advance, coated with adhesives and the shielding sheet 1 is wound in a spiral fashion so that both margins on the width of the shielding sheet 1 are overlapped with each other to ensure the covering of the surface of the cable 40.

The cable 40 leaks the electromagnetic wave around the circumference 20 due to the current flowing through the lead wire 42, or the cable 40 is affected by the electromagnetic wave from the outside, resulting in disturbance of the current. The electromagnetic wave however, can be reliably shielded by winding the shielding sheet 1. Furthermore, the shielding sheets 1, 1a, 1', and 1" have sufficient pliability, can be reduced in weight, resulting from burying relatively small amount of the metal powder 4 as the powder layer 3 and can be easily wound at the spot where various kinds of cables 40 are laid.

Figure 7B:
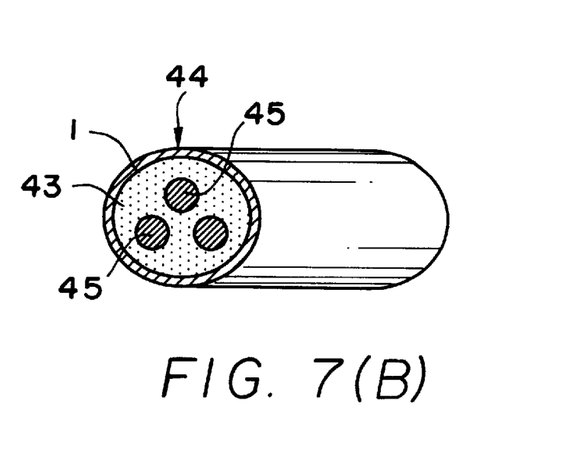

FIG. 7 (B) is a three-phase twist cable 44 to which the shielding sheet 1 is spirally wound on the surface thereof. The cable 44 is wound with an insulating material 43 around three parallel lead wires 45 and then is occupied with the shielding sheet 1 in a spiral fashion over the surface of the insulating material 43.

Figure 7C:
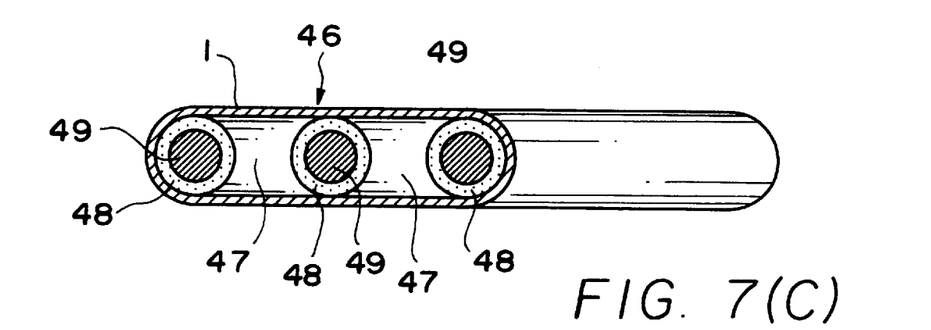

FIG. 7 (C) shows a lead cable 46 flatly wound with a shielding sheet 1 on the surface thereof. The cable 46 consists of three lead wires 49 which are wound with insulating materials 48 one by one, and arranged in a line, leaving a space 47 between each other. The cable is then wound with the shielding sheet 1 in a spiral fashion around the surface.

The shielding sheet 1, 1a, 1' and 1" are not only used for winding around the cable 40, but, depending on the room space to be shielded, it can also be stuck on a wall surface or a ceiling surface with adhesives, or it can be laid on a floor, and furthermore, it can be used in a computer room or a shielded room. In these cases, it is advantageous for the laying operation to use the shielding sheet of the present invention, because it can easily follow uneven portions of the room, owing to the pliability of the shielding sheet 1 and the like.

The sheets 1, 1a, 1' and 1" can be used in a suitable size by cutting to stick it in the inside or on the surrounding of an instrument having a magnetron such as a microwave oven and the like, a device and instrument which generate the electromagnetic waves or have a recording portion using a magnetic recording medium, such as a television, a video tape recorder, an audio instrument, a personal computer, or a portable phone.

The present invention is not limited to each embodiment explained above.

For instance, the metal powder can be selected, according to the electromagnetic wave to be shielded, from not only aforementioned metals but also from the group consisting of PC Permalloy—2 (78% Ni—Fe), PB Permalloy (45% Ni—Fe), PD Permalloy (36% Ni—Fe), Permalloy of 12% Mn—9.6% Cu—26% Fe—Ni, Invar alloy (Fe—36% Ni), Fe—Ni series alloy such as Fe—42% Ni, Fe—52% Ni, Kovar (Fe—29% Ni—17% Co), so called electromagnetic stainless steel such as Fe—10 to 18% Cr, Fe—3 to 10% Cr—3 to 10% Si, Fe—9 to 22% Ni—16 to 26% Cr, Fe—Cr—Al series alloy, Fe—Cr—Al—Si series alloy and so forth. Incidentally, the powder can be used in a granular shape.

In addition to the aforementioned polychloroprene rubber, the insulating layer (material) can be adopted from synthetic rubber such as polybutadiene rubber, polyisoprene rubber, ethylene propylene rubber, butadiene-acrylonitrile rubber, isobutylene-isoprene rubber, and stylenebutadiene rubber, and from various kinds of pliable plastics such as phenol group, epoxy group, polyester of various kinds, acryl group, polyvinyl acetate, polystylene, polyurethane, polyamide (for instance, nylon 12 or nylon 6).

The shielding sheet can be wound or stuck not only in one sheet, but, according to the object or conditions for shielding, can be also applied in a thin sheet with several turns on the same position. That is, the sheet can be used freely according to the environment, for instance, the sheet is wound in several turns around the electric cable near a precision measurement instrument, while it is wound in one turn on another position.

When synthetic rubber is used for the insulating layer, since it is excellent in weather resistance, a stable shieldability with less degradation can be obtained for long term use, even in the case of winding on an outdoor cable and the like.

Additionally, the shielding sheet of the present invention can be also used for absorbing a radio wave.

The shielding sheet of the present invention explained above ensures a high shieldability for a electromagnetic wave and a high absorbability for a radio wave with a sufficient pliability, it can be easily wound around various portions, such as around the electric cable, and it can be easily laid or stuck.

The production method according to the present invention ensures the easy and reliable preparation of the shielding sheet in a designated size or thickness.

What is claimed is:

1. A shielding sheet made by embedding soft magnetic metal or alloy powder within a pliable insulating layer whereby said pliable insulating layer contains powder embedded therein; said powder being distributed within said pliable insulating layer to thereby form at least one powder layer component containing a first concentration of metal or alloy powder distributed therein, and a remaining portion of said pliable insulating layer which contains a second concentration of metal or alloy powder distributed therein; with the proviso that the second concentration of metal or alloy powder is either zero or is present at a lesser concentration than said first concentration; and with the proviso that said at least one powder layer component extends either:

1) along at least one surface of the insulating layer; and/or
    2) within said insulating layer;

said metal or alloy powder being in the form of particles having an average diameter of less than or equal to 100 $\mu$m.

2. The shielding sheet according to claim 1, wherein the distribution of said powder is such that the ratio (expressed as a percentage) of the volume of particles contained in the powder layer to the volume of particles contained in the insulating layer is equal to or less than 70%.

3. The shielding sheet according to claim 1, wherein said soft magnetic metal is iron, nickel, or cobalt; and wherein said alloys are silicon steel, permalloy alloy, Sendust alloy, electromagnetic stainless steel such as Fe—Cr—Al series or Fe—Cr—Al—Si series, Fe—Co—V series alloys, amorphous alloys of Co series or Fe series, and ferrite series oxides.

4. The shielding sheet according to claim 1 wherein said powder is flat in shape, the aspect ratio of the powder being equal to or more than 2, and is oriented in a manner that the direction along the longer diameter of the powder is almost parallel to the plane surface of said insulating layer.

5. The shielding sheet according to claim 4, wherein said aspect ration is equal to or more than 5.

6. The shielding sheet according to claim 1 which contains said powder in an amount which is between 20% to 80% by volume of said sheet or between 40% to 98% by weight of said sheet.

7. The shielding sheet according to claim 1 which contains said powder in an amount which is equal to or more than 20% by volume of said sheet or equal to or more than 40% by weight of said sheet.

8. The shielding sheet according to claim 1, wherein said insulating layer is made of rubber or plastics.

9. The shielding sheet according to claim 1, wherein said insulating layer has a thickness of between 0.1 mm to 5 mm.

10. The shielding sheet according to claim 1, wherein said shielding sheet is used for shielding a radio wave and magnetism, and for absorbing a radio wave.

* * * * *